United States Patent [19]

Brennan et al.

[11] 3,794,887

[45] Feb. 26, 1974

[54] MOUNTING ARRANGEMENTS FOR PRINTED CIRCUIT BOARDS

[75] Inventors: David John Brennan; Loraine Leonard Williams, both of Solihull, England

[73] Assignee: Lucas Aerospace Limited, Birmingham, England

[22] Filed: Nov. 15, 1972

[21] Appl. No.: 306,818

[30] Foreign Application Priority Data

Nov. 17, 1971 Great Britain .................. 53,273/71

[52] U.S. Cl.. 317/101 DH, 317/101 CC, 248/358 A

[51] Int. Cl. .............................................. H02b 1/02

[58] Field of Search.........317/101 DA; 248/358 A; 339/17 LM, 17 F

[56] References Cited

UNITED STATES PATENTS

| | | | |
|---|---|---|---|
| 3,351,307 | 11/1967 | Michel et al. | 248/358 A |
| 3,873,109 | 2/1959 | Hartenstein et al. | 248/358 A |
| 2,939,905 | 6/1960 | Canfield | 339/17 F |

FOREIGN PATENTS OR APPLICATIONS

| | | | |
|---|---|---|---|
| 336,585 | 10/1930 | Great Britain | 248/358 A |

*Primary Examiner*—David Smith, Jr.
*Attorney, Agent, or Firm*—Holman & Stern

[57] ABSTRACT

A printed circuit board arrangement includes a frame and a plurality of flexible metal webs secured to the frame by their ends. A printed circuit board is secured to the webs so that each web has a free length between said frames and an adjacent edge of the board.

11 Claims, 3 Drawing Figures

MOUNTING ARRANGEMENTS FOR PRINTED CIRCUIT BOARDS

This invention relates to printed circuit board arrangements, and has as an object to provide such an arrangement in a convenient form.

According to the invention a printed circuit board arrangement comprises a frame, a plurality of flexible, thermally conductive webs secured at their respective ends to the frame, and a printed circuit board secured to said webs so that each web has adjacent each end thereof a free extending between the frame and an adjacent edge of the printed circuit board.

An example of a mounting arrangement according to the invention will now be described with reference to the accompanying drawings, in which.

A pair of printed circuit boards 10, 11 respectively comprise ceramic cards 12, 13 on which conductors have been provided by firing patterns of metallic ink. Circuit components, shown generally at 14 are secured to the conductor patterns of the boards 10, 11.

Figure 1:
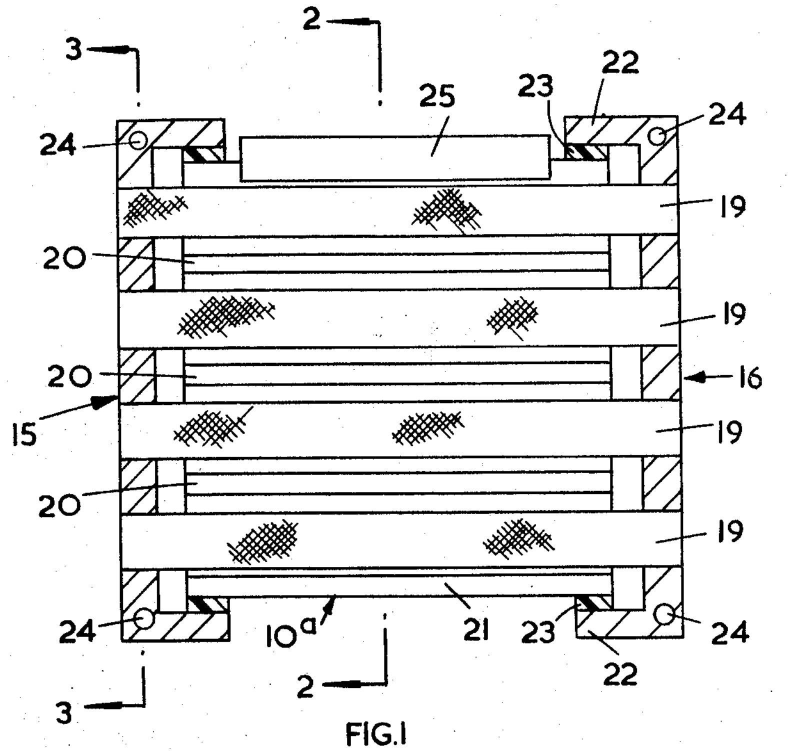
FIG. 1 is a section through a mounting arrangement.
Figure 2:
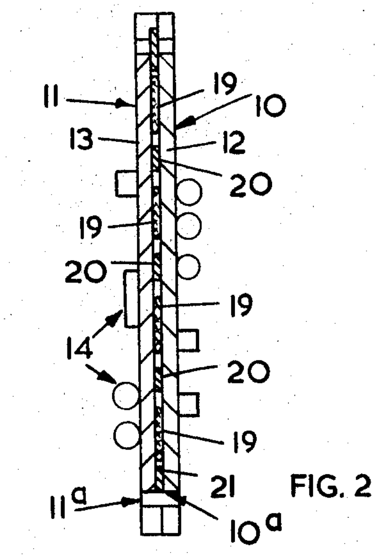
FIGS. 2 and 3 are sections on the corresponding lines in FIG. 1.
Figure 3:
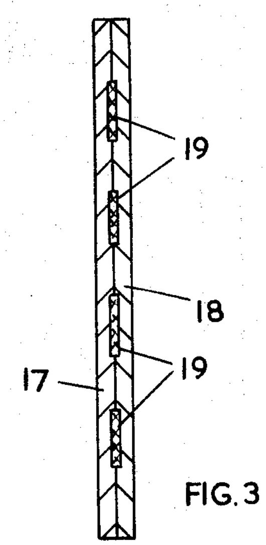

A pair of identical frame members 15, 16 each comprise a pair of elements 17, 18 as shown in FIG. 3. Elements 17, 18 are formed with slots which receive braided copper webs 19 which extend in spaced parallel relationship between the frame members 15, 16. Webs 19 are secured to members 15 16 by brazing, members 17 and 18 also being brazed together.

Interposed between the webs 19 are ceramic strips 20 of approximately the same thickness as the webs 19. The boards 10, 11 are secured to the webs 19 and to the strips 20 on opposite sides thereof by means of epoxy resin adhesive films which are preformed and lie against the inwardly directed faces of boards 10, 11. An additional ceramic strip 21 is interposed between the boards 10, 11 adjacent edges *10a*, *11a* thereof. During assembly the boards 10, 11 are urged towards on another and the adhesive cured at an elevated tamparature, as for example at 160° for two hours.

The dimensions of the boards 10 11 and the webs 19 are such that there exist free lengths of the webs 19 extending between the frame members 16, 15 and the adjacent edges of the boards. The frame members 15, 16 have projections 22 which overlap the boards 10, 11. Secured to the projections 22 are buffers 23 engageable by the edges of boards 10, 11 whereby movement of the boards 10, 11 in their own plane and transversely of the webs 19 is restricted. The frame members 15, 16 have through holes 24 by means of which members 15, 16 can be secured to a separate frame structure, not shown.

Secured betwwn boards 10, 11 adjacent edges thereof remote from edges *10a*, *11a* is a synthetic resin bonded printed circuit board 25 having conductors on both sides thereof. These conductors are connected to appropriate parts of the circuit on boards 10, 11 and are also arranged so that board 25 can act as a plug to be received by a known type of electrical socket.

The mounting arrangement described provides a support for boards 10, 11 whereby vibration applied to the frame members 15, 16 is substantially damped before reaching boards 10, 11. Webs 19 also act to conduct heat from boards 10, 11. One or more of webs 19 may also be used to provide an earth connection from boards 10, 11.

We claim

1. A printed circuit arrangement comprising a frame a plurality of flexible, thermally conductive webs secured at their respective ends to the frame, and a printed circuit board secured to said webs so that each web has adjacent each end thereof a free length extending between the frame and an adjacent edge of the printed circuit board.

2. An arrangement as claimed in claim 1 in which said frame comprises a two frame members to which said ends of said webs are respectively secured.

3. An arrangement as claimed in claim 1 in which said webs are arranged in spaced, substantially parallel ralationship.

4. An arrangement as claimed in claim 3 which includes a rigid strip between an adjacent pair of said webs, the ends of said strip being secured to said frame members.

5. An arrangement as claimed in claim 3 in each said frame member comprises a pair of frame elements between which said web ends are secured.

6. An arrangement as claimed in claim 5 in which one frame element in each pair thereof is formed with slots to receive the ends of said webs.

7. An arrangement as claimed in claim 2 in which said frame members include projections which overlap said printed circuit board, and which includes resilient buffers mounted on said projections so as to be engageable by said board to limit movement thereof in its own plane transversely of the lone axes of said webs.

8. An arrangement as claimed in claim 1 which includes two printed circuit boards secured to said webs on opposite sides thereof.

9. An arrangement as claimed in claim 8 which includes a further printed circuit board secured between said two boards and projecting beyond adjacent edges thereof, said further board being electrically connected to at least one of said two boards and including on its projecting portion a conductor pattern which serves as a plug connection for the arrangement.

10. An arrangement as claimed in claim 1 in which said printed circuit boards comprises a ceramic card and a conductor pattern on said card.

11. An arrangement as claimed in claim 1 in which said webs are formed of braided copper.

* * * * *